United States Patent [19]

Hall

[11] Patent Number: 4,665,328

[45] Date of Patent: May 12, 1987

[54] MULTIPLE CLOCK POWER DOWN METHOD AND STRUCTURE

[75] Inventor: Christopher M. Hall, Mountain View, Calif.

[73] Assignee: National Semiconductor Corporation, Santa Clara, Calif.

[21] Appl. No.: 635,029

[22] Filed: Jul. 27, 1984

[51] Int. Cl.⁴ ............... H03K 17/687; H03K 19/096; H03K 19/20

[52] U.S. Cl. ............................. 307/582; 307/200 A; 307/453; 307/443; 307/480; 365/227

[58] Field of Search ............... 307/269, 583, 453, 468, 307/443, 480, 481, 200 A, 582; 365/227, 233

[56] References Cited

U.S. PATENT DOCUMENTS 3,745,380  7/1973  Kitajima et al. ............... 307/269
4,011,468  3/1977  Fosler, Jr. et al. ............ 307/480

Primary Examiner—Stanley D. Miller
Assistant Examiner—M. R. Wambach
Attorney, Agent, or Firm—Gail W. Woodward

[57] ABSTRACT

A method and structure is provided for powering down a plurality of clocks in a predetermined sequence. In one embodiment, a clock is powered down when it reaches a predefined logical level following the receipt of a power down signal. In another embodiment, a clock is powered down in response to a power down signal when the clock reaches a predefined level, and all clocks derived from that clock reach predefined levels. This is accomplished by including an edge sense circuit for determining when a clock reaches a predefined level, circuitry for combining a plurality of logical signals which indicate when the clock has reached said predefined level, and when all clocks derived from that clock have been powered down. Means and structure are also provided for powering down internal read/write control signals in response to a power down signal, thereby minimizing power consumption which would occur if the read/write control signals were switching during the power down cycle.

5 Claims, 11 Drawing Figures

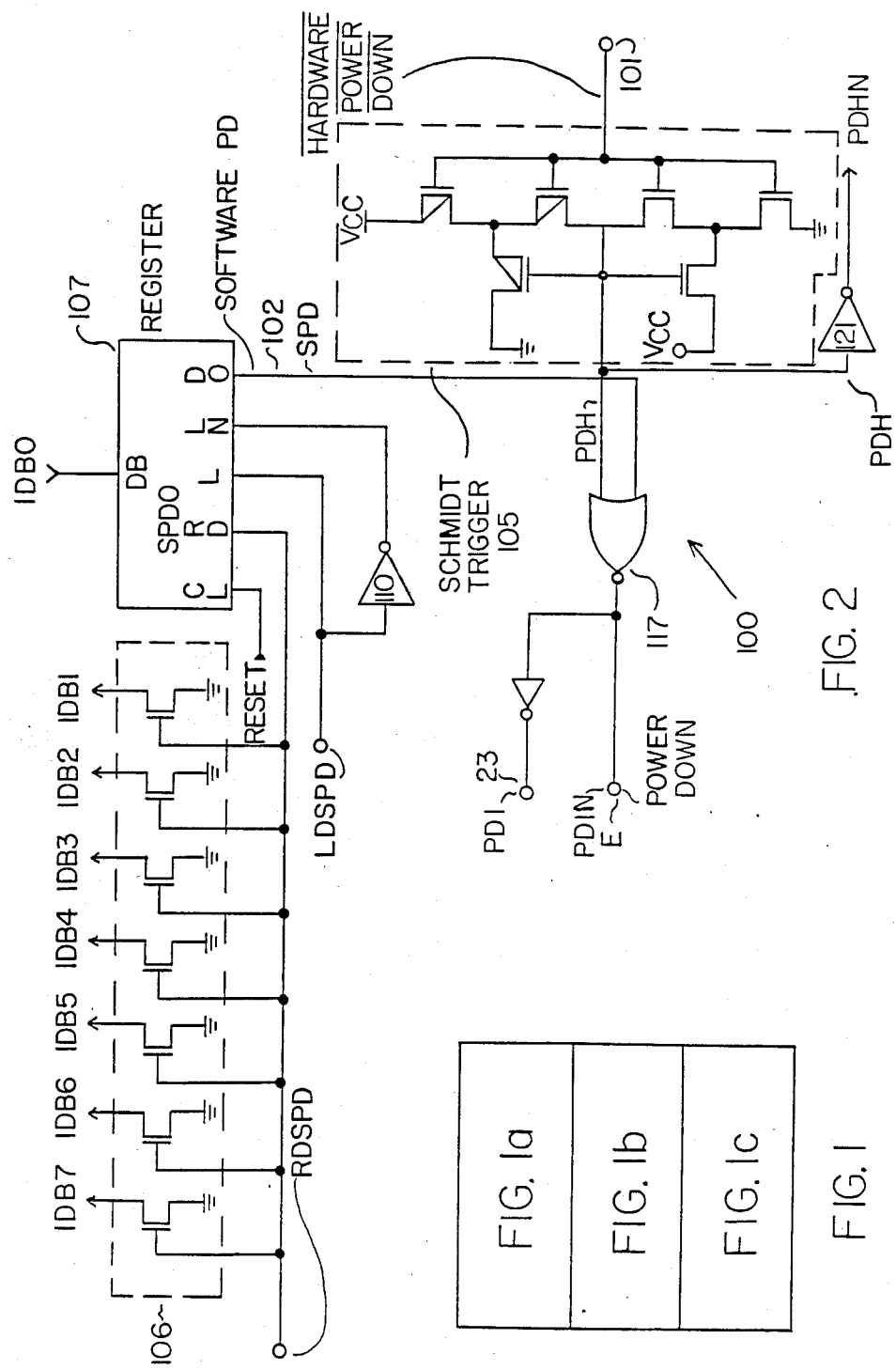

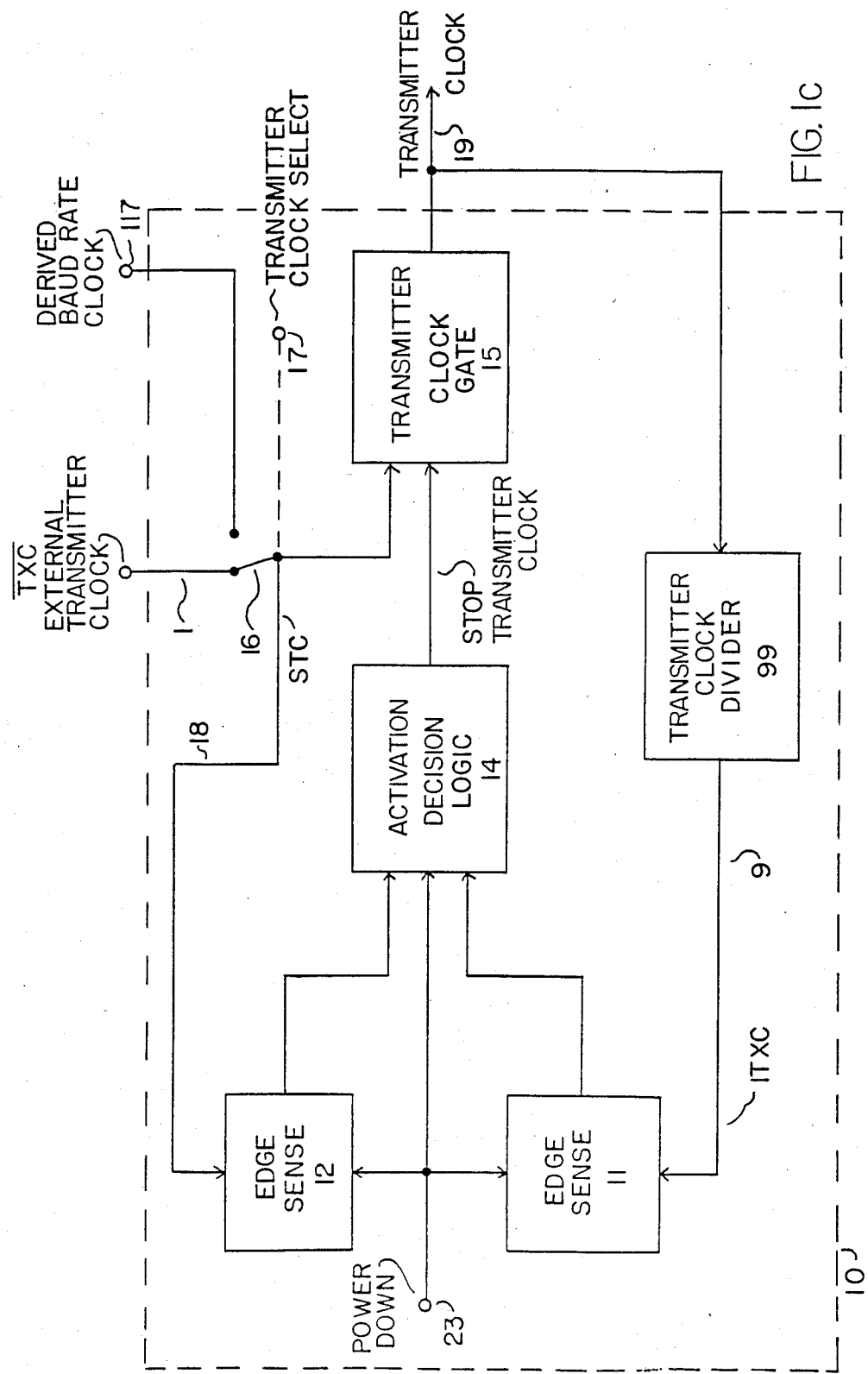

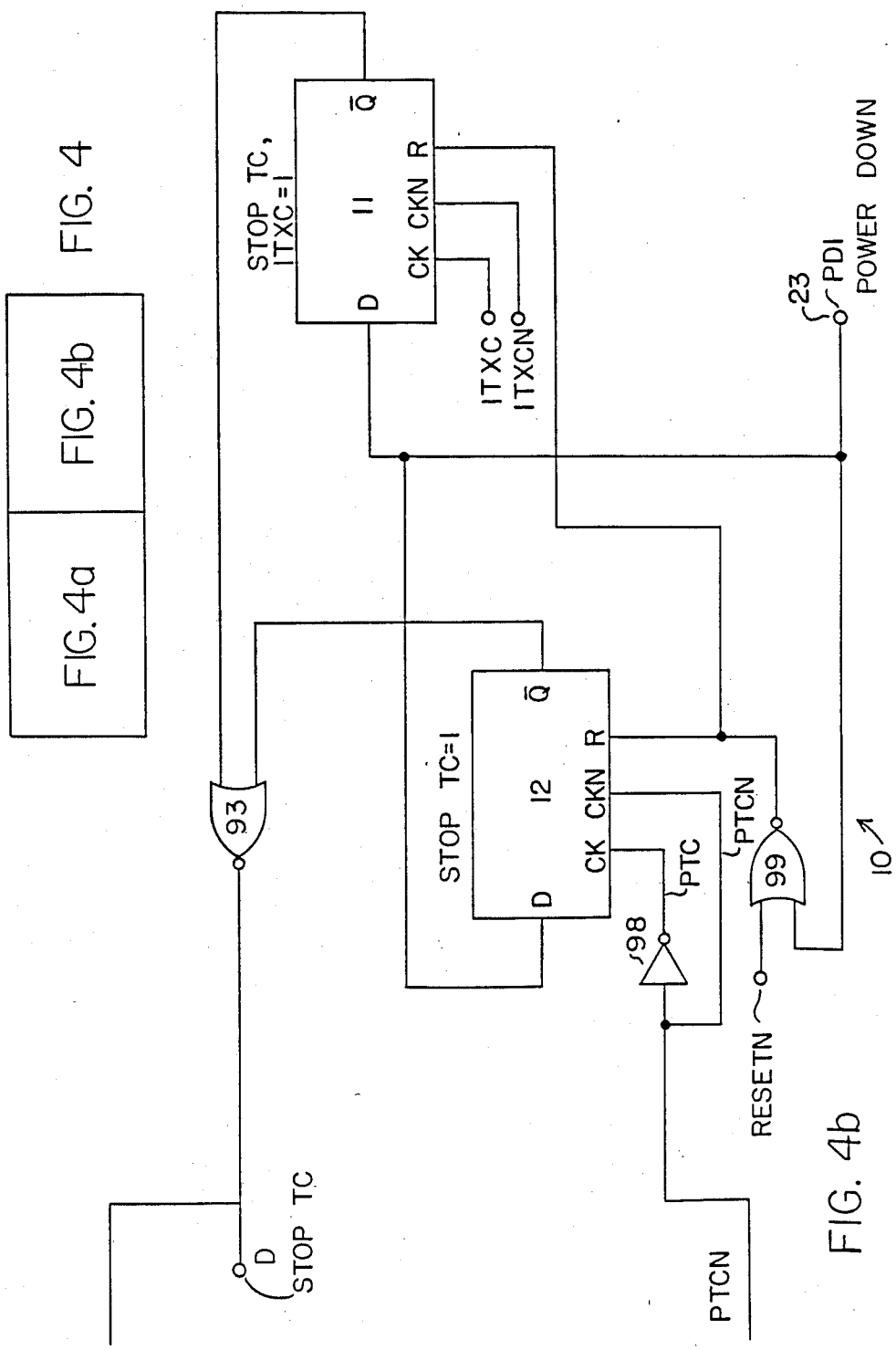

4,665,328

MULTIPLE CLOCK POWER DOWN METHOD AND STRUCTURE

BACKGROUND OF THE INVENTION

This invention relates to electronic circuits, and more particularly, to method and structure for causing a plurality of clock signals to be disabled in a specific order and at required levels (i.e., logical 1 or logical 0). This invention has particular applications in integrated circuits, particularly CMOS logic devices wherein it is desired to minimize power consumption during a power down period without the inadvertent loss of synchronization and/or data during such power down periods and subsequent power up periods.

In many circuits, particularly CMOS devices which are utilized to minimize power consumption, the system clock is disabled during the power down period. In this manner, power consumption of the device is minimized during such power down period. However, heretofore, there has never been a structure or method for powering down a plurality of clocks in a single circuit in a predetermined order in such a fashion as to maintain each clock at a predetermined level associated with the power down cycle. Accordingly, it has heretofore not been possible to produce circuits utilizing a plurality of clocks, whether independent from each other or derived from each other, which can all be powered down in a desired sequence. Many circuits require a plurality of clocks in order to function properly. For example, a universal asynchronous receiver and transmitter (UART), (such as the NSC 858 and the NS 8250, manufactured and sold by National Semiconductor Corporation, the assignee of this invention) requires three basic clocks: the receiver clock; the transmitter clock; and the baud rate clock. A UART is a device which is capable of receiving and transmitting a serial data stream and converting such serial data stream to a parallel format for communication with a device capable of receiving data in a parallel format, such as a central processing unit.

For example, when the incoming and outgoing serial data channels are operating at the same serial data rate, the receiver clock and the transmitter clock may be one and the same and, if desired, derived from the baud rate clock. On the other hand, when the two serial data channels are operating at different serial data rates, the receiver clock and the transmitter clock must differ.

SUMMARY

In accordance with the teachings of this invention, a method and structure is provided for powering down a plurality of clocks in a predetermined sequence. In one embodiment of this invention, a clock is powered down when it reaches a predefined logical level following the receipt of a power down signal. In another embodiment of this invention, a clock is powered down in response to a power down signal when the clock reaches a predefined level, and all clocks derived from that clock reach predefined levels. This is accomplished by including an edge sense circuit for determining when a clock reaches a predefined level, circuitry for combining a plurality of logical signals which indicate when the clock has reached said predefined level, and when all clocks derived from that clock have been powered down.

As an additional feature of this invention, means and structure are provided for powering down internal read/write control signals in response to a power down signal, thereby minimizing power consumption which would occur if the read/write control signals were switching during the power down cycle.

Both the powering down of clock signals, and the disabling of the internal read and write control signals is performed in a manner which allows completion of all necessary activity prior to the power down phase. The power down is also accomplished in a manner which allows the power down cycle to be ended with all clocks and the internal read/write control signals at predefined levels, thereby allowing a power down cycle to be ended in a predictable manner.

BRIEF DESCRIPTION OF THE DRAWINGS

FIG. 1 is a diagram depicting the interrelationship of FIGS. 1a through 1c;

FIG. 1c is a block diagram of another embodiment of a clock power down circuit constructed in accordance with the teachings of this invention;

FIG. 2 is a schematic diagram of one embodiment of power down select logic 100 of FIG. 1a, and related circuitry;

FIG. 4 is a diagram depicting the interrelationship of FIGS. 4a and 4b;

FIGS. 4a and 4b form a schematic diagram of one embodiment of clock power down circuit 10 of FIG. 1c;

FIG. 5 is a schematic diagram of one embodiment of clock power down circuit 30 of FIG. 1a;

DETAILED DESCRIPTION

Figure 1A:
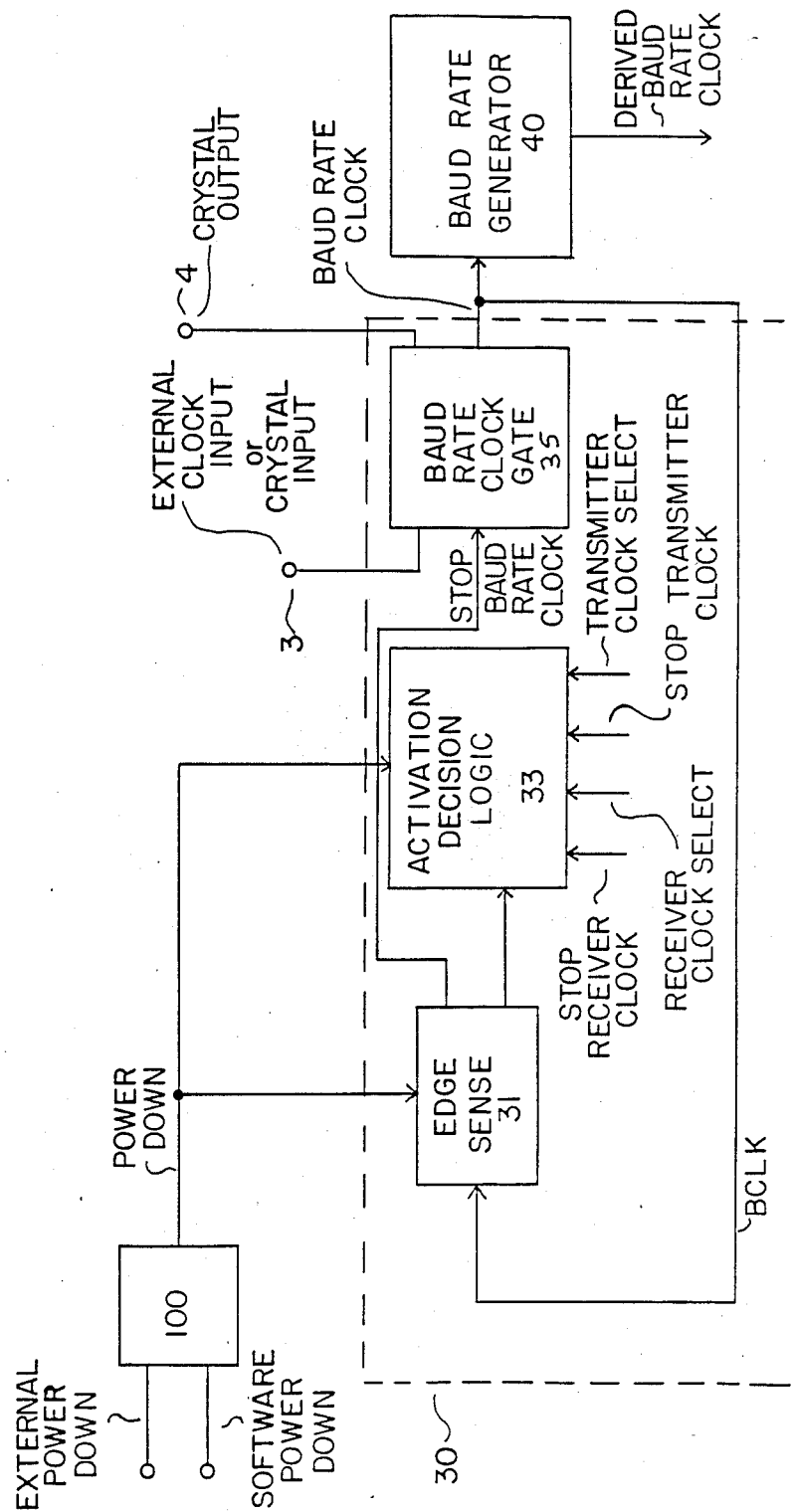
FIG. 1a is a block diagram of one embodiment of a clock power down circuit constructed in accordance with the teachings of this invention.
Figure 1B:
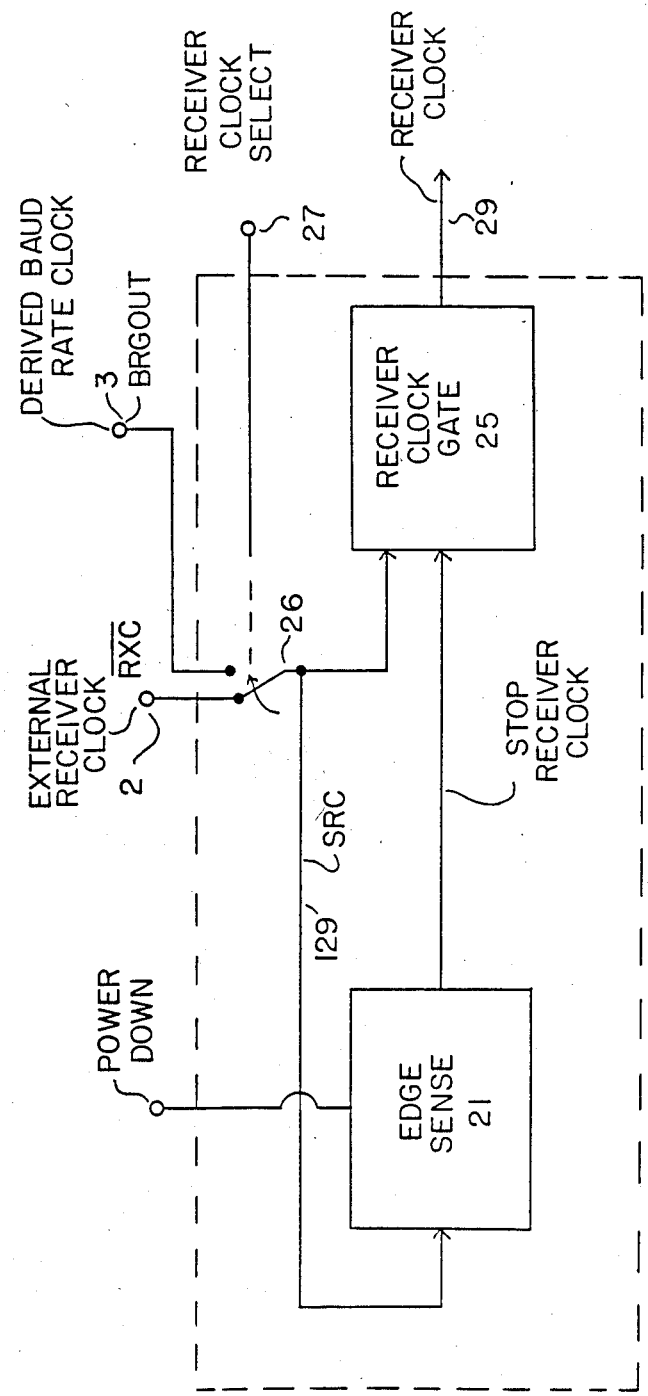
FIG. 1b is a block diagram of another embodiment of a clock power down circuit constructed in accordance with the teachings of this invention.

FIG. 1 is a block diagram of the clock portion of a UART constructed in accordance with the teachings of this invention. The structures of FIG. 1 includes three power down subcircuits, 10, 20, 30 as shown respectively in FIGS. 1c, 1b and 1a, each capable of stopping its associated clock. In the embodiments shown in FIG. 1, three separate types of power down subcircuits are shown. First, the receiver power down subcircuit 20 in FIG. 1b will power down its associated receiver clock when a power down signal is provided, regardless of the state of the other clocks in the circuit (i.e., the transmitter clock and the baud rate clock), and furthermore, without regard to the state of any clock derived from the receiver clock. Secondly, transmitter power down subcircuit 10 in FIG. 1c powers down the transmitter clock in response to a power down signal when a clock which is derived from the transmitter clock makes its next transition to a predefined level, in this embodiment, a logical 1a. Thirdly, FIG. 1 includes baud rate clock power down subcircuit 30 which powers down the baud rate clock in response to a power down signal.

The baud rate clock power down subcircuit 30 powers down the baud rate clock only after the receiver clock, if derived from the baud rate generator, has powered down, and the transmitter clock, if derived from the baud rate clock, has powered down.

The receiver clock can be provided either as an external clock signal or, if desired, can be derived from the baud rate clock, utilizing baud rate generator 40 in FIG. 1a. Similarly, the transmitter clock can be provided either as an external clock signal or can be derived from the baud rate clock utilizing baud rate generator 40.

Baud rate generator 40 is, for example, a counter well known to those of ordinary skill in the art. In the embodiment shown in FIG. 1a, a single baud rate generator 40 is shown, although it is to be understood that a plurality of baud rate generators can be utilized to derive from the baud rate clock a plurality of clock signals of differing frequencies.

The power down signal is provided by power down select logic 100 in response to input signals indicating an external power down (initiated by hardware external to the UART) and a software power down signal which is provided in response to the CPU writing a specified command to a software power down register (not shown) in the UART. The power down signal shown in FIG. 1a as applied to subcircuit 30 can also be applied to power down subcircuits 10 and, 20, of FIGS. 1c and 1b.

Referring now to receiver clock power down subsection 20 (FIG. 1b), switch 26 selects as the input clock to subsection 20 either an external receiver clock $\overline{RXC}$, or the derived baud rate clock from baud rate generator 40 (see FIG. 1a.). Switch 26 operates in response to the receiver clock select signal applied to input terminal 27 which is provided by a specific register (not shown) in the UART which is written to by the CPU to define which clock is to be used as the receiver clock. The selected receiver clock is then applied via lead 129 to edge sense circuit 21 which, in response to a power down signal, provides an output signal indicating when the next transition to the logical 1 level is attained. The output signal from edge sense circuit 21 is applied as a control signal to the stop receiver clock gate 25, thereby providing an output receiver clock on output lead 29 at a logical 1 level, as desired. Conversely, when a power down signal is not received, the output signal from edge sense circuitry 21 enables the receiver clock selected by switch 26 to pass through receiver clock gate 25 to receiver clock output lead 29. Table I (at the end of this specification) depicts the events which must occur in order to stop the receiver clock.

Referring now to transmitter clock power down subsection 10 (FIG. 1c), switch 16 selects as the input clock to subsection 10 either an external transmitter clock TXC, or the derived baud rate clock from baud rate generator 40 of FIG. 1a. Switch 16 operates in response to the transmitter clock select signal applied to input terminal 17 which is provided by a specific register (not shown) in the UART which is written to by the CPU to define which clock is to be used as the transmitter clock. Edge sense circuit 11 provides an output signal when the divided down transmitter clock signal ITXC provided on input lead 9 makes its next transition to a logical 1 state. Similarly, edge sense circuit 12 provides an output signal when the fundamental transmitter clock STC applied to input lead 18 makes its next transition to a logical 1 level following the power down signal. The output signals from edge sense circuits 11 and 12 are applied to the input leads of activation decision logic 14 which provides a stop signal when an output signal is received from both edge sense circuit 11 and edge sense circuit 12. This output signal from activation decision logic 14 disables the transmitter clock gate 15, thereby providing a logical 1 transmitter clock output signal on output lead 19. Conversely, when activation decision logic 14 does not provide a stop signal, the transmitter clock gate 15 provides on output lead 19 the clock signal which has been selected by switch 16. Table II (at the end of this specification) depicts the events which must occur in order to stop the transmitter clock.

Referring now to the baud rate clock power down subcircuit 30 (FIG. 1a), edge sense circuit 31 provides an output signal in response to a power down signal upon the next transition of the baud clock BCLK to a logical 1 level and when activation decision logic 33 provides an output signal indicating that all other appropriate clocks have been stopped. Activation decision logic 33 receives as input signals the stop signal from the receiver clock power down subcircuit 20 of FIG. 1b, the stop signal from the transmitter clock power down subcircuit 10 of FIG. 1a and the receiver clock select and the transmitter clock select signals. Thus, if the receiver clock is selected as a clock to be derived from the baud rate generator 40 of FIG. 1a, the receiver clock must be stopped prior to stopping the baud rate clock. Similarly, if the transmitter clock is selected to be derived from the baud rate generator 40 of FIG. 1a, the transmitter clock must be stopped before the baud rate clock can be stopped. Table III (at the end of this specification) depicts the events which must occur in order to stock the baud rate clock.

A more detailed schematic diagram of one embodiment of power down select logic 100 of FIG. 1a is shown in FIG. 2. The HARDWARE POWER DOWN signal is received on terminal 101 and connected to Schmitt Trigger 105 which serves to minimize noise in the Hardware Power Down Signal. Throughout the specification and drawings, a P channel MOS transistor is shown having a diagonal line connected between its source and drain leads, and an N-channel MOS transistor is shown without such a diagonal line. The PDH output signal from Schmitt Trigger 105 is applied to one input lead of NOR gate 117, and also to the input lead of inverting buffer 121. Inverting buffer 121 provides an inverted signal PDHN for use by other portions of the circuitry, if desired. Power down select logic 100 also includes register 107 which stores a software power down bit. The status of software power down bit stored in register 107 is set by a microprocessor or the external circuit (not shown), in order to specify when power down select logic 100 is to provide a power down signal in response to software control. The software power down signal (SPD) is applied via lead 102 from register 107 to the other input lead of NOR gate 117. In this manner, NOR gate 117 provides a logical 0 power down output signal PDIN, and inverter 23 provides a logical 1 PDI output signal, in response to either a software power down signal from register 107, or a hardware power down signal from external circuitry (not shown) via input terminal 101.

Also shown in FIG. 2 is a plurality of pull down means 106 which serve to pull down data lines internal to the UART in response to a Read Software Power Down Register (RDSPD) command to register 107. In this manner, RDSPD reads the single bit software power down register 107 on the least significant bit of the internal data bus, while the remaining bits read logical 0. Also, the LDSPD signal serves to write the least significant bit from the internal data bus into the (single bit) software power down register 107.

Figure 3:
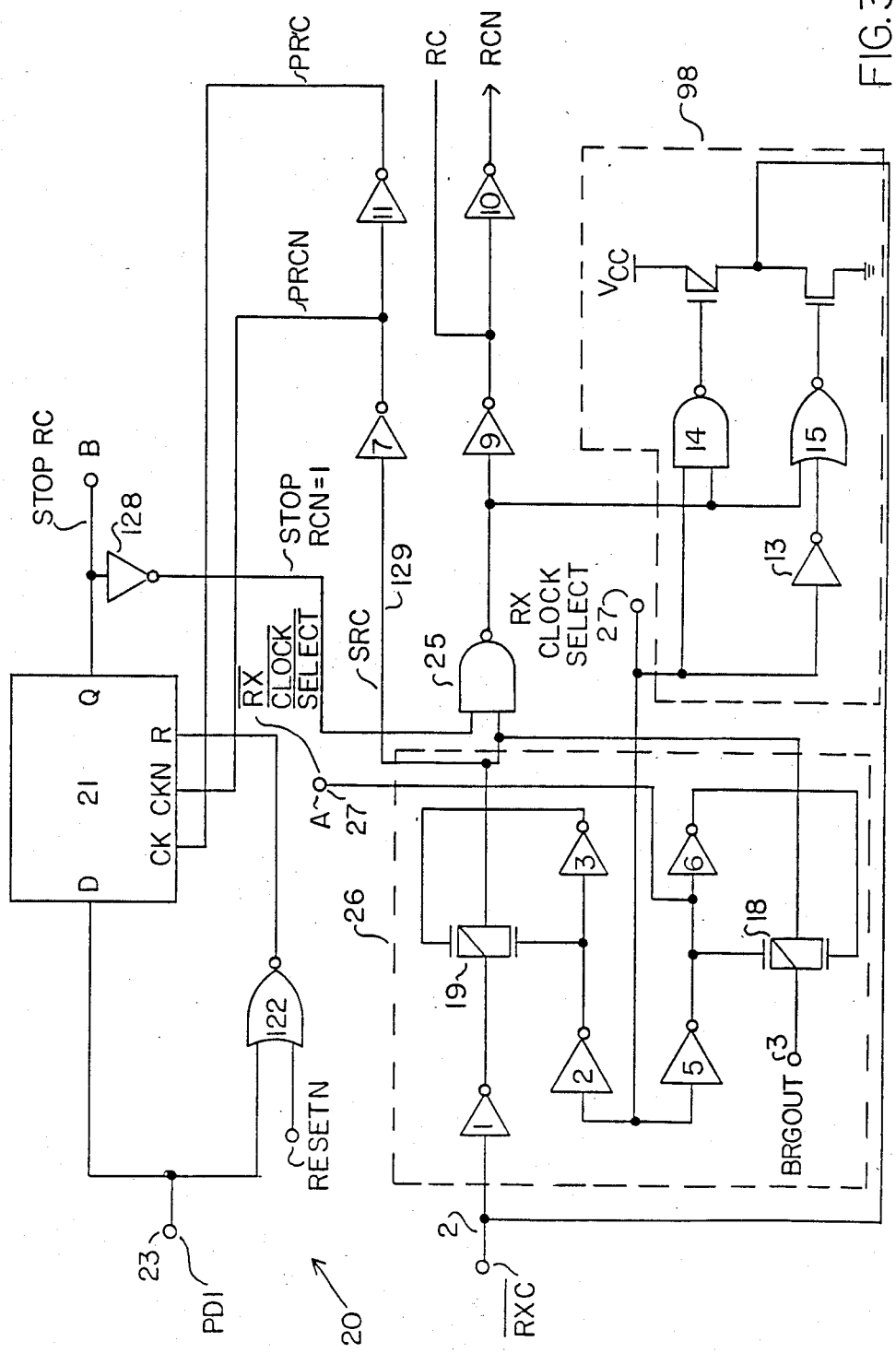
FIG. 3 is a schematic diagram of one embodiment of clock power down circuit 20 of FIG. 1b.

FIG. 3 is a more detailed schematic diagram of one embodiment of receiver clock power down subcircuit 20. As shown in FIG. 3, receiver clock power down subcircuit includes switch means 26, which selects as the receiver clock signal either the externally applied receiver clock $\overline{RXC}$ applied to input terminal 2 or BRGOUT derived from the baud rate generator 40 (FIG. 1a) which is applied to input terminal 3. Switch means 26 operates in response to the receiver clock select signal applied to input terminal 27. Thus, when the receiver clock select signal is a logical 0, the output signals from inverters 2 and 5 are logical 1, and transmission gate 19 is enabled and transmission gate 18 is disabled, thus selecting the $\overline{RXC}$ signal as the selected receiver clock (SRC) signal to be applied to output lead 129 of switch means 26. Conversely, when the receiver clock select signal applied to input terminal 27 is a logical 1, transmission gate 19 is disabled and transmission gate 18 is enabled, thereby selecting the BRGOUT signal as the selected receiver clock (SRC) signal to be applied to output lead 129 of switch means 26. The selected receiver clock is also applied to inverting buffers 7 and 11 in order to provide clock signals PRC and PRCN, respectively, to the clock and inverse clock input leads of D-type edge sense flip flop 21. The selected receiver clock is also applied to one input lead of receiver clock gate 25. The output signal from receiver clock gate 25 is applied to inverting buffers 9 and 10 in order to provide receiver clock signals RC and RCN, respectively. The output signal from receiver clock gate 25 is also applied to buffer 98, which serves to provide on terminal 2 the clock signal when the receiver clock signal is generated internally from baud rate generator 40 (FIG. 1a). Conversely, when the receiver clock select signal is a logical 0 indicating that the external receiver clock is to be received on input terminal 2, buffer 98 is disabled.

D-type flip flop 21 serves to sense when the edge of the selected receiver clock makes a transition to the logical 1 state when a power down signal is received. Thus, the power down (PDI) signal is applied to the D input lead of edge sense flip flop 21, which provides a logical 1 Q output signal in response to the next logical 1 transition of the PRC clock. This logical 1 Q output signal from edge sense flip flop 21 is inverted by inverter 128 to provide a logical 0 STOP RCN signal to the enable input lead of receiver clock gate 25, thereby forcing the output of receiver clock gate 25 to a logical 1 state regardless of the state of the selected clock signal. Since the clock is held at a level consistent with the most recent clock transition, there is no spike generated on the output lead of the receiver clock gate 25. Conversely, when a logical 0 power down signal is received and a logical 0 RESETN signal is received and applied to the other input lead of NOR gate 122, a logical 1 reset signal is applied to edge sense flip flop 21, thereby causing the Q output signal from edge sense flip flop 21 to be a logical 0. This logical 0 Q output signal is inverted by inverter 128, thereby providing a logical 1 signal to the enable input lead of receiver clock gate 25, thereby enabling receiver clock gate 25 to pass the selected receiver clock signal to its output lead. The Q output signal from edge sense flip flop 21 is also provided to other circuitry (such as to activation decision logic 33 of FIG. 1a) by terminal B. Terminal A is connected to stop baud clock subcircuit 30 (FIG. 1a), as described below.

Figure 4A:
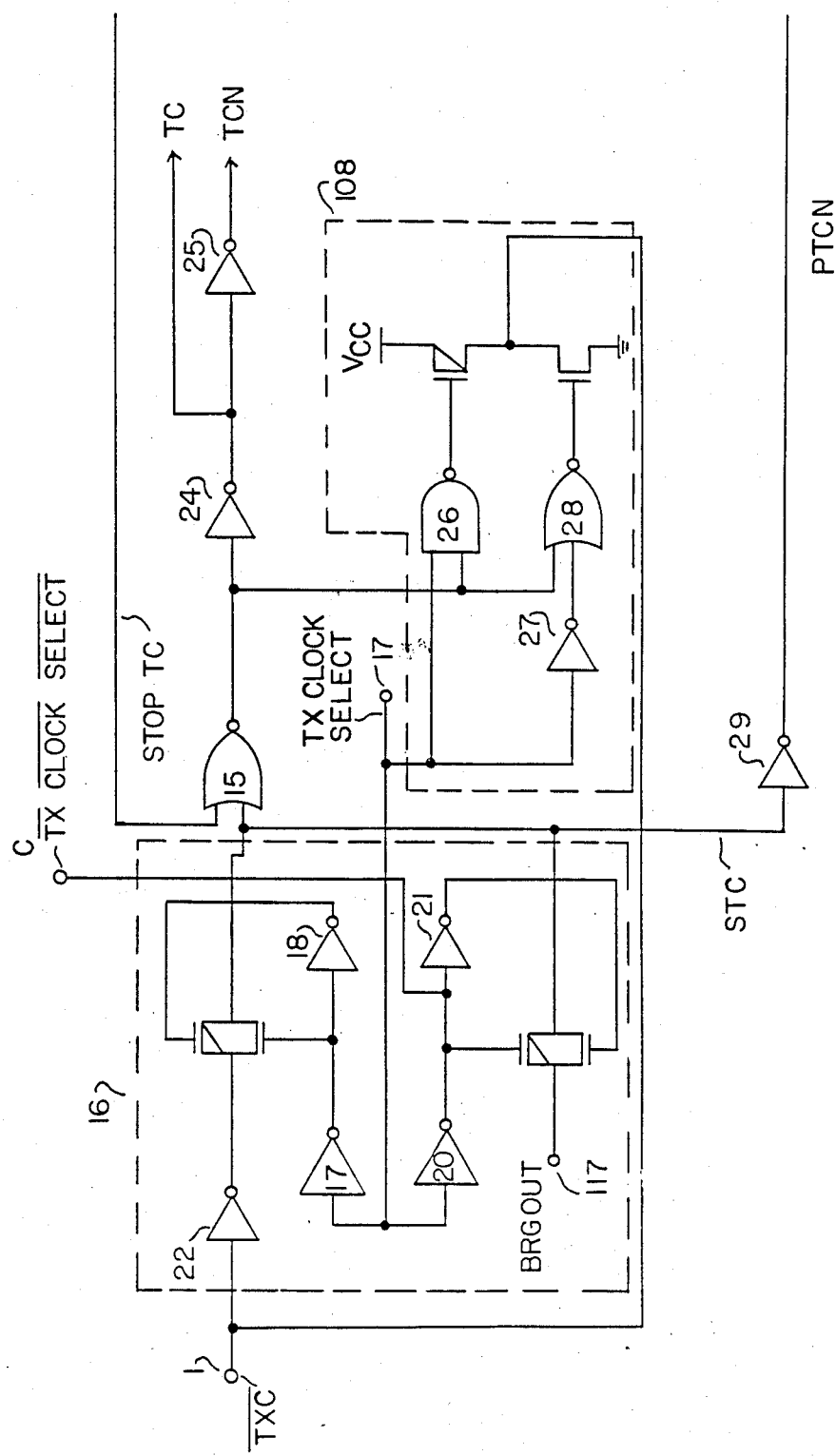

FIG. 4, which is composed of FIGS. 4a and 4b, is a more detailed schematic diagram of one embodiment of transmitter clock power down subcircuit 10 of FIG. 1c. Switch means 16 operates in a similar fashion as switch means 26 of FIG. 3 in order to select the transmitter clock STC from either the external transmitter clock $\overline{TXC}$ applied to terminal 1, or the output signal BRGOUT applied to terminal 117 from baud rate generator 40 (FIG. 1a) in response to the transmitter clock select signal applied to input terminal 17. Buffer 108 operates in a similar fashion as buffer 98 of FIG. 3, and serves to provide the BRGOUT signal to terminal 1 when the BRGOUT signal is selected as the transmitter clock. Terminal C is connected to stop baud clock subcircuit 30 (FIG. 1a), as described below. Edge sense D-type flip flop 11 serves to sense the next logical 1 transition of the ITXC output clock from transmitter clock divider 99 (FIG. 1c) in response to a logical 1 power down (PDI) signal received on terminal 23. Thus, with a logical 1 power down signal applied to the D input lead of edge sense flip flop 11, a logical 0 $\overline{Q}$ output signal is provided in response to the next logical 1 transition of the ITXC clock. In a similar fashion, D-type edge sense flip flop 12 serves to detect the next logical 1 transition of the transmitter clock TC in response to a logical 1 power down signal. Thus, with a logical 1 power down signal applied to the D input lead of edge sense flip flop 12, a logical 0 $\overline{Q}$ output signal is provided in response to the next logical 1 transisition of transmitter clock PTC. Transmitter clock PTC, and its inverse clock PTCN, are provided to edge sense flip flop 12 by inverters 98 and 29, respectively.

The $\overline{Q}$ output signals from edge sense flip flops 11 and 12 are reset in response to a logical 0 power down signal and a logical 0 reset signal applied to the input leads of NOR gate 99, whose output signal is applied to the reset input leads of edge sense flip flops 11 and 12. The logical 0 $\overline{Q}$ output signals from edge sense flip flops 11 and 12 are applied to the input leads of NOR gate 93, which thus provides a logical 1 stop TC signal when the $\overline{Q}$ output signals of both edge sense flip flops 11 and 12 are logical 0. Thus, a logical 1 STOP TC signal is applied to the enable input lead of transmitter clock gate 15, thus forcing the output signal from transmitter clock gate 15 to a logical 0, regardless of the state of the selected transmitter clock which is applied to the other input lead of transmitter clock gate 15, thereby disabling the transmitter clock. Similar to the receiver clock, the transmit clock is held at a level consistent with the most recent transition of the transmitter clock and the clock derived from the transmitter clock, thus no spike occurs on either the transmitter clock signal or the clock signal derived from the transmitter clock. Conversely, when one or both of the $\overline{Q}$ output signals from edge sense flip flops 11 and 12 are a logical 1, the STOP TC output signal from NOR gate 93 is a logical 0, thus enabling transmitter clock gate 15 to pass the selected transmitter clock signal to its output lead. The output signal from transmitter clock gate 15 is inverted by inverters 24 and 25 in order to provide the transmitter clock signal TC, and its inverse TCN, respectively.

Figure 5:
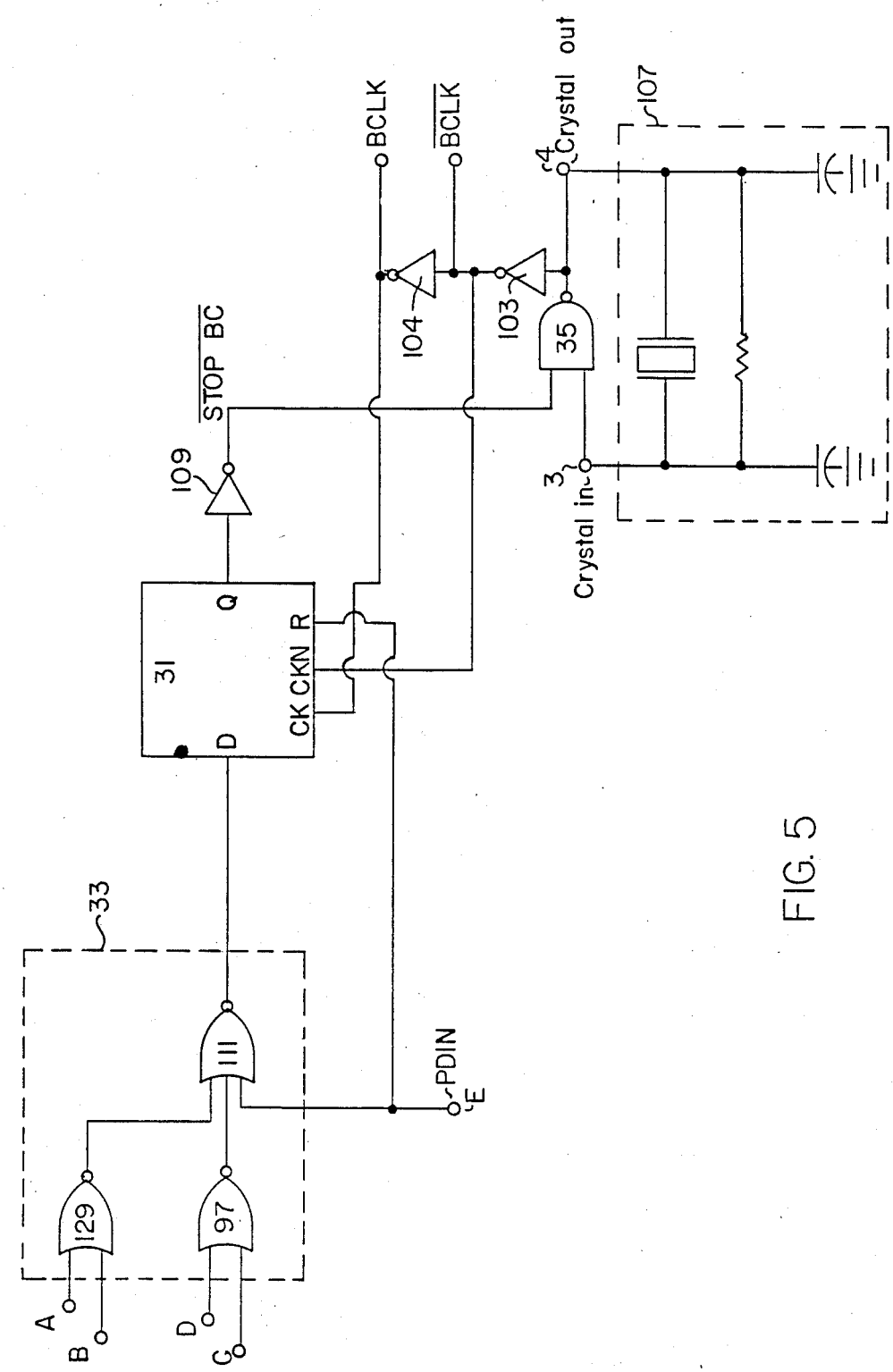

FIG. 5 is a more detailed schematic diagram of one embodiment of baud rate clock power down subcircuit 30. NOR gates 97 and 129 receive as input signals on terminals A, B, C and D, the $\overline{RX}$ $\overline{CLOCK}$ $\overline{SELECT}$ signal from terminal A of FIG. 3, the STOP RC signal from terminal B of FIG. 3, the $\overline{\text{TX}}$ $\overline{\text{CLOCK}}$ $\overline{\text{SELECT}}$ signal from terminal C of FIG. 4a, and the $\overline{\text{STOP}}$ $\overline{\text{TC}}$ signal from terminal D of FIG. 4b, respectively. NOR gate 111 serves to combine the output signals from NOR gates 97 and 129 and the PDIN power down signal received on terminal E of FIG. 5 from terminal E of FIG. 2. Thus, when the receiver clock is selected to be external, the $\overline{\text{RX}}$ $\overline{\text{CLOCK}}$ $\overline{\text{SELECT}}$ signal received on terminal A is a logical 1, thereby forcing the output signal of NOR gate 129 to a logical 0, thereby causing the receiver clock to have no effect upon the disabling of the baud rate clock. Similarly, when the transmitter clock is selected to be external, the $\overline{\text{TX}}$ $\overline{\text{CLOCK}}$ $\overline{\text{SELECT}}$ signal received on terminal C is a logical 1, thereby forcing the output signal of NOR gate 97 to a logical 0, thereby causing the transmitter clock to have no effect on the disabling of the baud rate clock. Edge sense D-type flip flop 31 serves to sense the next logical 0 to logical 1 transition of the baud rate clock BCLK when the output signal from NOR gate 111 is a logical 1. Thus, edge sense flip flop 31 detects the first logical 0 to logical 1 transition of the baud rate clock BCLK following a power down signal and signals indicating that both the receiver clock and the transmitter clock are externally selected, or if either receiver or transmitter clock is derived from the baud rate clock, that the derived clock has been powered down. Thus, with a logical 1 output signal from NOR gate 111 applied to the D input lead of edge sense flip flop 31, a logical 1 Q output signal is provided in response to the next logical 0 to logical 1 transition of the BCLK clock. This output signal is buffered and inverted by inverter 109 to provide a $\overline{\text{STOP}}$ $\overline{\text{BS}}$ signal to the enable input lead of baud rate clock gate 35. Baud rate clock 35 also receives on its other input lead the externally applied crystal clock signal on input terminal 3. In response to a logical 0 $\overline{\text{STOP}}$ $\overline{\text{BC}}$ signal, baud rate clock gate 35 provides a logical 1 output signal regardless of the state of the crystal input clock. Conversely, in response to a logical 1 $\overline{\text{STOP}}$ $\overline{\text{BC}}$ signal, baud rate clock gate 35 passes an inverted version of the externally supplied crystal clock to its output lead, which is connected to output terminal 4. A typical crystal network 107 is shown connected between terminals 3 and 4. Alternatively, a clock signal generated from any suitable source can be applied between terminal 3 and ground. The output signal from the output lead of baud rate clock gate 35 is also applied to inverters 103 and 104 in order to provide the inverted baud rate clock $\overline{\text{BCLK}}$ and the baud rate clock BCLK, respectively, for use by the UART.

Figure 6:
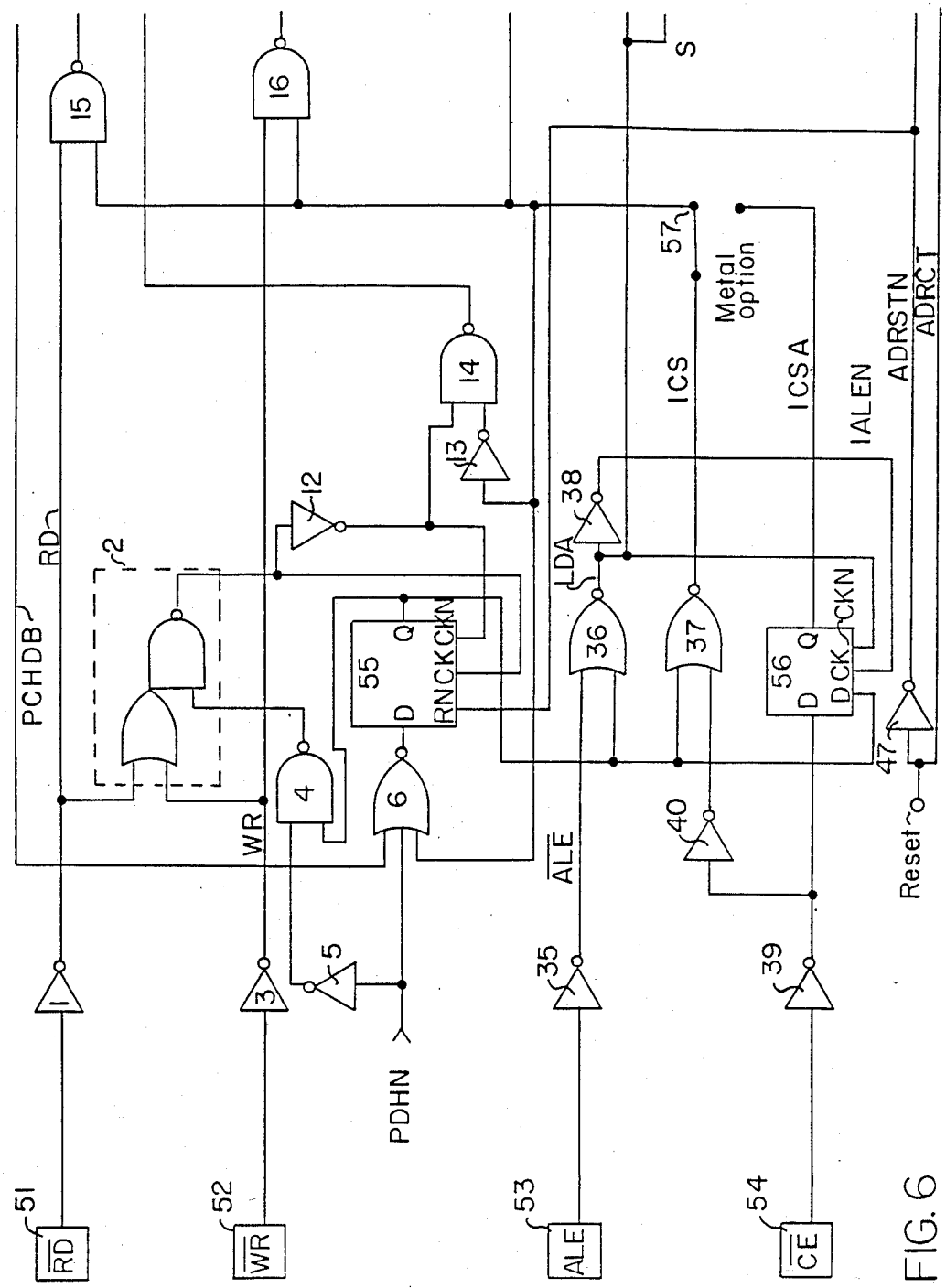
FIG. 6 is a schematic diagram of one embodiment of internal read/write control signal power down circuit constructed in accordance with the teachings of this invention.
Figure 6:
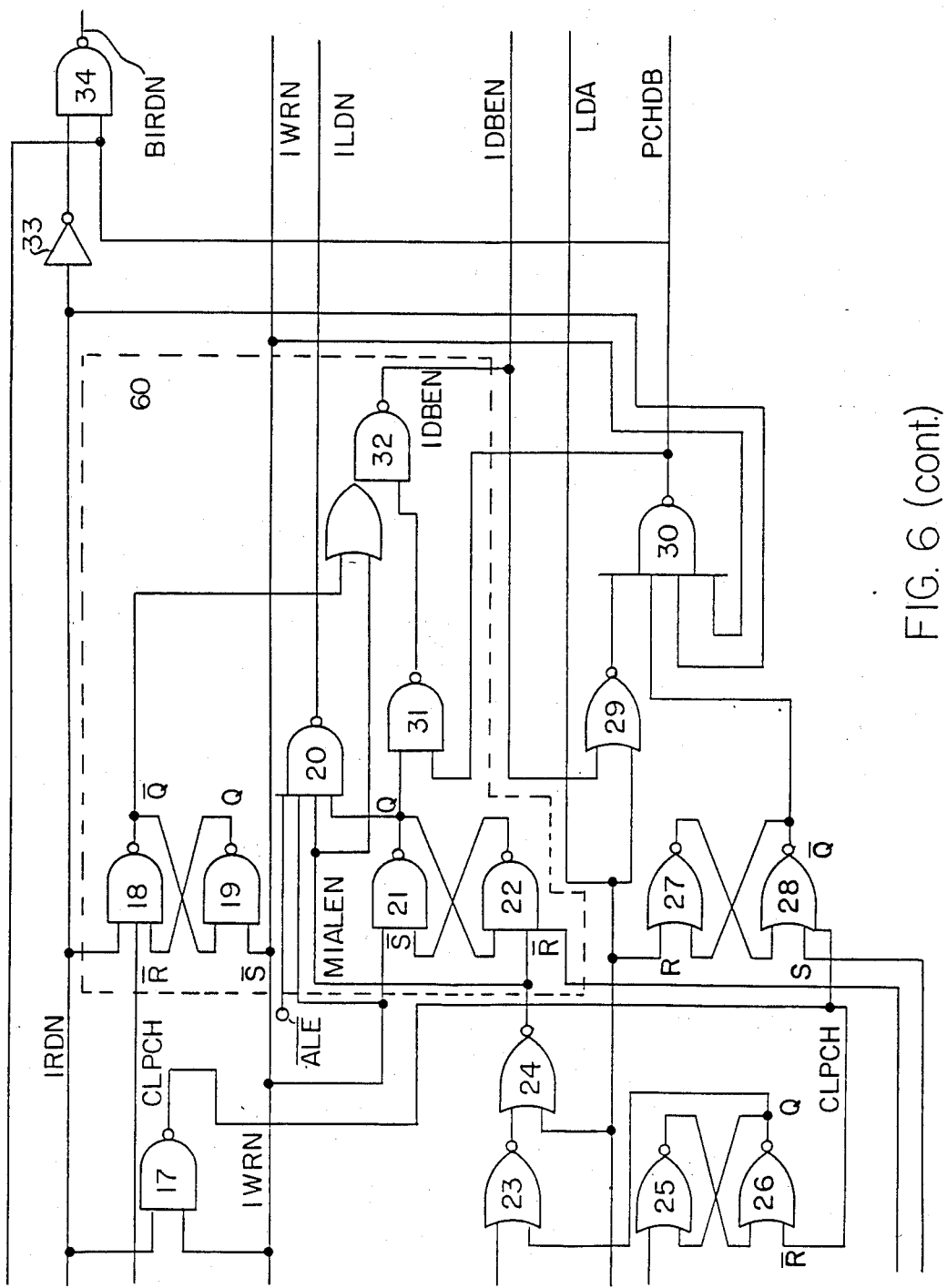

A schematic diagram of one embodiment of this invention which includes means for powering down internal read/write control signals in the UART is shown in the schematic diagram of FIG. 6. Terminals 51 and 52 receive read and write signals $\overline{\text{RD}}$ and $\overline{\text{WR}}$, respectively. These read and write signals are inverted by inverters 1 and 3 to provide RD and WR signals, respectively, to OR-NAND gate 2. OR-NAND gate 2 also receives an input signal from NAND gate 4 which provides a logical 1 output signal when the Q output signal from D-type power down status latch 55 is a logical 0, or when the power down PDHN signal from power down select logic 100 (FIG. 2) is a logical 1 indicating that the chip is not to be powered down. Thus, OR-NAND gate 2 provides an output signal having a logical 1 to logical 0 transition in response to a logical 1 to logical 0 transition of either the $\overline{\text{RD}}$ or $\overline{\text{WR}}$ signal, so long as the output signal from NAND gate 4 is a logical 1 indicating that the UART is not powered down and is not to be powered down at this time. In this manner, the output signal from OR-NAND gate 2 serves as an input clock signal to D-type power down status latch 55. This clock signal allows latch 55 to store a logical 1 D input signal only after completion of the currently executed read or write instruction. The D input lead of latch 55 receives an input signal from NOR gate 6, which in turn receives as its input signals the precharge data bus (PCHDB), power down hardware (PDHN), and internal chip select (ICS) signals. In this manner, NOR gate 6 provides a logical 1 output signal indicating that the device is to be powered down only in response to a logical 0 PDHN signal when the PCHDB signal is a logical 0, indicating that the data bus lines are precharged to a known value, and the internal chip select (ICS) signal is a logical 0, indicating that this device is currently deselected. With the PCHDB set at a logical 0, the internal data bus lines (not shown) are pulled high, in a manner which is well known by those of ordinary skill in the art.

While this discussion indicates that the internal chip select signal ICS is applied to one input lead of NOR gate 6, it is also shown in FIG. 6 that it is possible to utilize D-type chip enable flip flop 56 in order to latch the inverse of the chip enable $\overline{\text{CE}}$ signal in order to provide an alternate internal chip select signal ICSA. In this event, connection is made between node 57 to the Q output lead of flip flop 56. Preferably, this alternative connection is made by way of altering the metallic interconnection formed on the integrated circuit device.

With the logical 1 output signal from NOR gate 6 stored in latch 55, latch 55 provides a logical 1 Q output signal indicating that the device is to be powered down. This logical 1 Q output signal is applied to one input lead of NAND gate 4, thereby causing NAND gate 4 to provide a logical 0 output signal when the PDHN signal is a logical 0, indicating that the device is to remain powered down. This logical 0 output signal from NAND gate 4 is applied to one input lead of OR-NAND gate 2, thereby causing OR-NAND gate 2 to provide a logical 1 output signal, thereby ceasing the clocking of D-type flip flop 55. In this manner, the device remains powered down as long as the PDHN input signal is a logical 0. Conversely, when the PDHN signal becomes a logical 1, indicating that the device is no longer to be powered down, inverter 5 provides a logical 0 input signal to NAND gate 4, thereby causing NAND gate 4 to provide a logical 1 output signal to OR-NAND gate 2, thereby allowing OR-NAND gate 2 to provide an output signal which makes a logical 1 to logical 0 transition in response to each logical 1 to logical 0 transition of the $\overline{\text{RD}}$ and $\overline{\text{WR}}$ signals, thereby once again clocking flip flop 55. At this time, with a logical 1 PDHN signal applied to one input lead of NOR gate 6, the output signal from NOR gate 6 is a logical 0, thereby causing flip flop 55 to store a logical 0 in response to the next clock signal from OR-NAND gate 2 which, as previously described, occurs upon the next logical 0 to logical 1 transition of the $\overline{\text{RD}}$ or $\overline{\text{WR}}$ signals, which indicate the end of a read or a write cycle. Thus, during the first read or write cycle after PDHN goes from a logical 0 to a logical 1, the device can not be read or written into.

The Q output signal from flip flop 55 is also applied to one input lead of NOR gates 36 and 37, as well as to the reset input lead of D-type flip flop 56. The logical 1 Q output signal from flip flop 55 is applied to one input lead of NOR gate 36, causing the output lead of NOR gate 36 to provide a logical 0 load addresses (LDA) signal, thereby preventing addresses from being received on address input leads (not shown). In a similar fashion, with the logical 1 Q output signal from flip flop 55 being applied to one input lead of NOR gate 37, NOR gate 36 provides a logical 0 ICS output signal. The logical 0 ICS output signal is applied to NAND gates 15 and 16, thereby providing logical 1 IRDN and IWRN signals, respectively, thereby preventing any reading or writing of the device. With a logical 1 Q output signal from flip flop 55 provided to the reset input lead of flip flop 56, the Q output signal from flip flop 56 is reset to a logical 0, thus providing a logical 0 ICSA signal which serves the same function as the previously-described logical 0 ICS signal when node 57 is selected to receive the ICSA signal in place of the ICS signal.

Conversely, when the Q output signal from flip flop 55 is a logical 0 (i.e., the device is not powered down), the logical 0 Q output signal from flip flop 55 is applied to one input lead of NOR gate 36, causing the output lead of NOR gate 36 to provide a load addresses (LDA) signal equal to the externally applied ALE signal, thereby allowing addresses to be received on address input leads (not shown) when the ALE signal is a logical 1. In a similar fashion, with the logical 0 Q output signal from flip flop 55 applied to one input lead of NOR gate 37, NOR gate 37 provides an ICS output signal which is the inverse of the externally applied $\overline{CE}$ signal. With a logical 0 $\overline{CE}$ signal, the logical 1 ICS output signal is applied to NAND gates 15 and 16, thereby enabling NAND gates 15 and 16 to provide IRDN and IWRN signals in response to the $\overline{RD}$ and $\overline{WR}$ signals, respectively. With a logical 0 Q output signal from flip flop 55 provided to the reset input lead of flip flop 56, the Q output signal from flip flop 56 stores the inverse of the value of the $\overline{CE}$ signal in response to a logical 0 ALE signal which, through inverter 35, NOR gate 36, and inverter 38, provides a logical 1 clock signal to flip flop 56. This provides an ICSA signal which serves the same function as the previously-described ICS signal when node 57 is selected to receive the ICSA signal in place of the ICS signal.

Figure 7A:
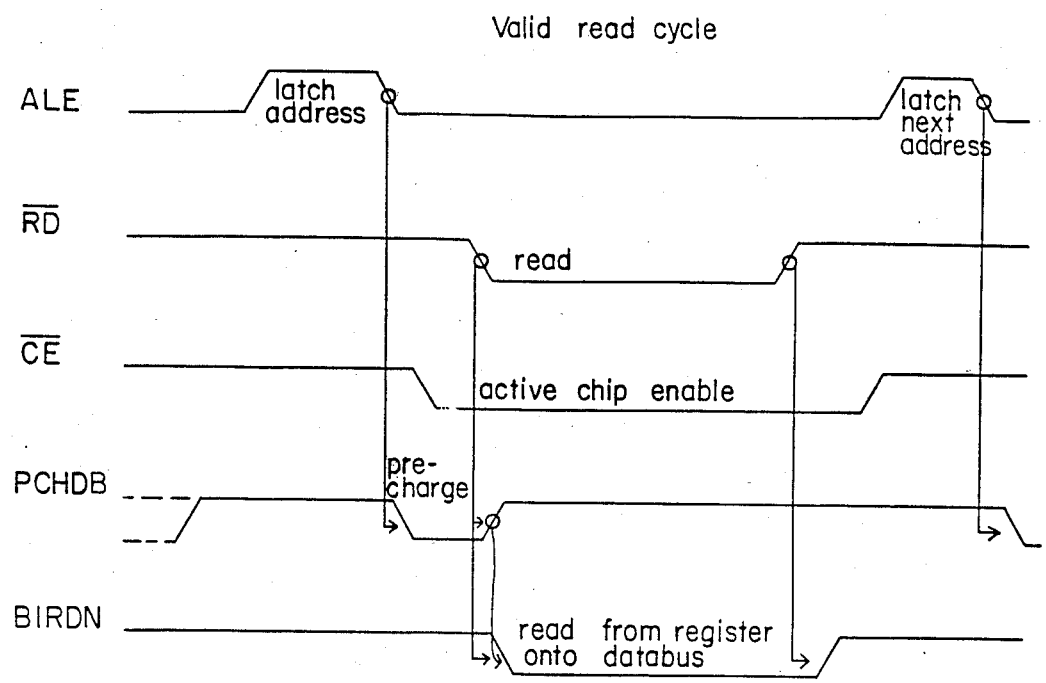
FIGS. 7a and 7b are timing diagrams depicting the operation of certain signals within the internal read/write control signal power down circuit shown in FIG. 6.
Figure 7B:
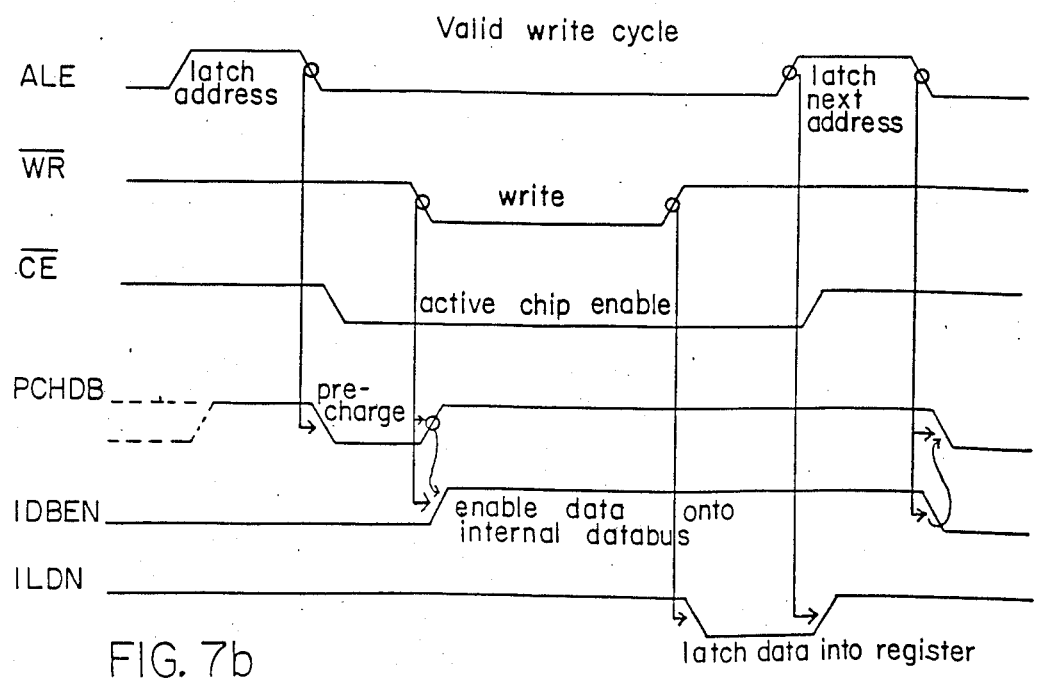

FIG. 7a depicts certain waveforms during a read cycle when the device is not powered down. During a read cycle, the address latch enable (ALE) signal goes to a logical 1, thereby causing address information to be stored in address registers (not shown). In response to the logical 1 to logical 0 transition of the ALE signal, the PCHDB signal goes low, thereby precharging the internal data bus leads as previously described. The $\overline{CE}$ signal then becomes a logical 0, thereby enabling the read operation. The $\overline{RD}$ signal then goes low, indicating that the read operation is to take place. This causes the PCHDB signal to go to a logical 1, thereby ending the precharge operation. This in turn causes the buffered internal read (BIRDN) signal to go to a logical 0, thereby allowing reading of the addressed register and in turn the transfer of data from that register to the external data bus. Following the read operation, the $\overline{RD}$ signal goes to a logical 1, thereby causing the BIRDN signal to go to a logical 1.

Referring to FIG. 6, when the ALE input signal goes to a logical 1, the $\overline{ALE}$ signal goes to a logical 0, and the LDA signal goes to a logical 1. This logical 1 LDA signal is applied to one input lead of NOR gate 29, thereby providing a logical 0 output signal to one input lead of NAND gate 30. This in turn causes NAND gate 30 to provide a logical 1 output signal which serves as the PCHDB signal. LDA signal is also stored in the RS latch formed by cross-coupled NOR gates 27 and 28, thereby providing a logical 1 $\overline{Q}$ output signal from NOR gate 28 which serves as the input signal to another input lead of NAND gate 30. Similarly, since a read or write operation is not yet in progress, the IRDN and IWRN signals are both logical 1, and are applied to the remaining two input leads of NAND gate 30. The internal data bus enable signal IDBEN is a logical 0 at this time, as described below, and thus the output signal from NOR gate 29 is a logical 1 thereby causing the output signal from NAND gate 30 to become a logical 0, thereby causing the precharging of the internal data bus lines.

Data bus write control logic 60 provides a logical 0 internal data bus enable signal IDBEN when it is desired to not write to the device, and provides a logical 1 IDBEN signal when it is desired to write to the device. This is accomplished in the following manner. The latch formed by cross-coupled NAND gates 18 and 19 serves to provide a logical 1 $\overline{Q}$ output signal when the previous read/write instruction was a read instruction (logical 0 $\overline{RD}$ signal), and provides a logical 0 $\overline{Q}$ output signal when the previous read/write instruction was a write instruction (logical 0 $\overline{WR}$ signal). This $\overline{Q}$ output signal is also a logical 0 when the output signal from NAND gate 14 is a logical 0 in response to a read or write instruction when the $\overline{CE}$ signal is a logical 1. The flip flop formed by cross-coupled NAND gates 21 and 22 provides a logical 1 Q output signal in response to a write instruction, and is reset to a logical 0 in response to either the next ALE signal or when $\overline{CE}$ goes to a logical 1. The $\overline{Q}$ output signal from NAND gate 18 and the Q output signal from NAND gate 21 are combined by NAND gate 31 and OR-NAND gate 32 to provide a logical 0 IDBEN output signal in response to a logical 0 $\overline{WR}$ signal, and to provide a logical 0 IDBEN signal in response to the next logical 1 ALE signal. Similarly, NAND gate 20 combines the $\overline{ALE}$ signal, the Q output signal from NAND gate 21, the IWRN signal from NAND gate 16, and the output signal from NOR gate 24 to provide a logical 0 ILDN signal in response to the logical 0 to logical 1 transition of the $\overline{WR}$ signal and provide a logical 1 ILDN signal in response to the next logical 0 and logical 1 transition of the ALE signal.

In this manner, the circuit of FIG. 6 prevents read or write instructions from being executed when the device is powered down, thereby further minimizing power consumption in the power-down state, while insuring that all instructions are executed and all signals remain at the proper logical levels.

While this specification illustrates specific embodiments of this invention, it is not to be interpreted as limiting the scope of the invention. Many embodiments of this invention will become evident to those of ordinary skill in the art in light of the teachings of this specification.

TABLE I

| Receiver clock power down subsection 20. | | | |
|---|---|---|---|
| Receiver Clock Select | Power Down | Receiver Clock Level | Stop Receiver Clock |
| External | No | 0 | No |
| External | No | 1 | No |
| External | Yes | 0 | No |
| External | Yes | 1 | Yes |

TABLE I-continued

Receiver clock power down subsection 20.

| Receiver Clock Select | Power Down | Receiver Clock Level | Stop Receiver Clock |
|---|---|---|---|
| Derived from Baud Rate Clock | No | 0 | No |
| Derived from Baud Rate Clock | Yes | 0 | No |
| Derived from Baud Rate Clock | No | 1 | No |
| Derived from Baud Rate Clock | Yes | 1 | Yes |

TABLE II

Transmitter Clock Power Down Subsection 10.

| Transmitter Clock Select | Power Down | Fundamental Transmitter Clock Level | Divided Transmitter Clock Level | Stop Transmitter Clock |
|---|---|---|---|---|
| External | No | 0 | 0 | No |
| External | No | 0 | 1 | No |
| External | No | 1 | 0 | No |
| External | No | 1 | 1 | No |
| External | Yes | 0 | 0 | No |
| External | Yes | 0 | 1 | No |
| External | Yes | 1 | 0 | No |
| External | Yes | 1 | 1 | Yes |
| Derived from Baud Rate Clock | No | 0 | 0 | No |
| Derived from Baud Rate Clock | No | 0 | 1 | No |
| Derived from Baud Rate Clock | No | 1 | 0 | No |
| Derived from Baud Rate Clock | No | 1 | 1 | No |
| Derived from Baud Rate Clock | Yes | 0 | 0 | No |
| Derived from Baud Rate Clock | Yes | 0 | 1 | No |
| Derived from Baud Rate Clock | Yes | 1 | 0 | No |
| Derived from Baud Rate Clock | Yes | 1 | 1 | Yes |

TABLE III

| Receiver Clock Select | Transmitter Clock Select | Power Down | Stop Receiver Clock | Stop Transmitter Clock | Baud Rate Clock Level | Stop Baud Rate Clock |
|---|---|---|---|---|---|---|
| External | External | No | No | No | 0 | No |
| " | " | No | No | No | 1 | No |
| " | " | Yes | No | No | 0 | No |
| " | " | Yes | No | No | 1 | Yes |
| " | " | Yes | No | Yes | 0 | No |
| " | " | Yes | No | Yes | 1 | Yes |
| " | " | Yes | Yes | No | 0 | No |
| " | " | Yes | Yes | No | 1 | Yes |
| " | " | Yes | Yes | Yes | 0 | No |
| " | " | Yes | Yes | Yes | 1 | Yes |
| External | Derived From Baud Rate Clock | No | No | No | 0 | No |
| " | Derived From Baud Rate Clock | No | No | No | 1 | No |
| " | Derived From Baud Rate Clock | Yes | No | No | 0 | No |
| " | Derived From Baud Rate Clock | Yes | No | No | 1 | No |
| " | Derived From Baud Rate Clock | Yes | No | Yes | 0 | No |
| " | Derived From Baud Rate Clock | Yes | No | Yes | 1 | Yes |
| " | Derived From Baud Rate Clock | Yes | Yes | No | 0 | No |
| " | Derived From Baud Rate Clock | Yes | Yes | No | 1 | No |
| " | Derived From Baud Rate Clock | Yes | Yes | Yes | 0 | No |
| " | Derived From Baud Rate Clock | Yes | Yes | Yes | 1 | Yes |
| Derived From Baud Rate Clock | External | No | No | No | 0 | No |
| Derived From Baud Rate Clock | " | No | No | No | 1 | No |
| Derived From Baud Rate Clock | " | Yes | No | No | 0 | No |
| Derived From Baud Rate Clock | " | Yes | No | No | 1 | No |
| Derived From Baud Rate Clock | " | Yes | No | Yes | 0 | No |
| Derived From Baud Rate Clock | " | Yes | No | Yes | 1 | No |
| Derived From Baud Rate Clock | " | Yes | Yes | No | 0 | No |
| Derived From Baud Rate Clock | " | Yes | Yes | No | 1 | Yes |
| Derived From Baud Rate Clock | " | Yes | Yes | Yes | 0 | No |

TABLE III-continued

| Receiver Clock Select | Transmitter Clock Select | Power Down | Stop Receiver Clock | Stop Transmitter Clock | Baud Rate Clock Level | Stop Baud Rate Clock |
| --- | --- | --- | --- | --- | --- | --- |
| Derived From Baud Rate Clock | " | Yes | Yes | Yes | 1 | Yes |
| Derived From Baud Rate Clock | Derived From Baud Rate Clock | No | No | No | 0 | No |
| Derived From Baud Rate Clock | Derived From Baud Rate Clock | No | No | No | 1 | No |
| Derived From Baud Rate Clock | Derived From Baud Rate Clock | Yes | No | No | 0 | No |
| Derived From Baud Rate Clock | Derived From Baud Rate Clock | Yes | No | No | 1 | No |
| Derived From Baud Rate Clock | Derived From Baud Rate Clock | Yes | No | Yes | 0 | No |
| Derived From Baud Rate Clock | Derived From Baud Rate Clock | Yes | No | Yes | 1 | No |
| Derived From Baud Rate Clock | Derived From Baud Rate Clock | Yes | Yes | No | 0 | No |
| Derived From Baud Rate Clock | Derived From Baud Rate Clock | Yes | Yes | No | 1 | No |
| Derived From Baud Rate Clock | Derived From Baud Rate Clock | Yes | Yes | Yes | 0 | No |
| Derived From Baud Rate Clock | Derived From Baud Rate Clock | Yes | Yes | Yes | 1 | Yes |

I claim:

1. A clock power down circuit comprising:
a first terminal for receiving a first clock input signal;
a second terminal for providing a clock output signal;
a third terminal for receiving a power down signal;
a fourth terminal for receiving a second clock input;
a clock gate having a first input lead connected to said first terminal, an output lead connected to said second terminal, and having a second input lead;
first edge sense means for detecting when a selected one of said first clock input signal or said clock output signal reaches a selected logical level after said power down signal is received, said first edge sense means having a clock input lead connected to a selected one of said first terminal or said second terminal, a power down input lead connected to said third terminal, and an output lead for providing a first edge sense output signal when said selected said one of said first clock input signal or clock output signal reaches a selected logical level after said power down signal is received;
second edge sense means for detecting when said second clock input signal reaches a selected logical level after said power down signal is received, said second edge sense means having a clock input lead connected to said fourth terminal, a power down input lead connected to said third terminal, and an output lead for providing a second edge sense output signal when said second clock input signal reaches a selected logical level after said power down signal is received; and
activation decision logic means having a first input lead connected to said output lead of said first edge sense means, a second input lead connected to said output lead of said second edge sense means, and an output lead for providing an activation decision output signal in response to said first and said second edge sense output signals, said output lead of said activation decision logic means being connected to said second input lead of said clock gate, wherein said clock gate provides a clock output signal of a selected logical level in response to said activation decision output signal.

2. A clock power down circuit as in claim 1 wherein said second clock is derived from said first clock.

3. A clock power down circuit comprising:
a first terminal for receiving a first clock input signal;
a second terminal for providing a clock output signal;
a third terminal for receiving a power down signal;
activation means for receiving information regarding one or more additional clock signals, said information indicating whether said one or more additional clock signals must be powered down prior to the power down of said clock output signal and whether said one or more additional clock signals have been powered down, said means for receiving providing an output signal when all of said one or more additional clock signals which must be powered down prior to the power down of said clock output signal have been powered down and a power down signal has been received on said third terminal; a clock gate having a first input lead connected to said first terminal, an output lead connected to said second terminal, and having a second input lead; and
edge sense means for detecting when a selected one of said clock input signal or said clock output signal reaches a selected logical level after said power down signal is received and said output signal from said activation means is received, said edge sense means having a clock input lead connected to a selected one of said first terminal or said second terminal, a power down input lead connected to said third terminal, an activation input lead for receiving said output signal from said activation means, and an output lead for providing an edge sense output signal when said selected said one of said clock input signal or clock output signal reaches a selected logical level after said power down signal is received and after said output signal from said activation means is received, said output lead being connected to said second input lead of said clock gate, wherein said clock gate provides a clock output signal of a selected logical level in response to said edge sense output signal.

4. A clock power down circuit as in claim 3 wherein said information indicates that a selected one of said one or more additional clocks must be powered down prior to the powering down of said first clock when said selected one of said one or more additional clocks is derived from said first clock.

5. A method for powering down a first clock at a first selected level comprising the steps of:
provinding a power down signal when said first clock is to be powered down;
determining if a second clock is derived from said first clock;
upon receipt of said power down signal, determining when said first clock makes a transistion to said first selected level;
upon receipt of said power down signal, determining said second clock is stopped; and
stopping said first clock at said first selected level in response to said power down signal when said first clock makes a transition to said first selected state and, if said second clock is derived from said first clock, when said second clock is stopped.

* * * * *